(12) United States Patent
Osborn et al.

(10) Patent No.: US 12,166,259 B1
(45) Date of Patent: Dec. 10, 2024

(54) ASYNCHRONOUS REVERSIBLE FLUX SOLITON LOGIC GATES

(71) Applicant: The Government of the United States as represented by the Director, National Security Agency, Ft. George G. Meade, MD (US)

(72) Inventors: Kevin D. Osborn, Clarksville, MD (US); Waltraut Wustmann, Dunedin (NZ)

(73) Assignee: Government of the United States as represented by the Director, National Security Agency, Ft. George G. Meade, MD (US)

(*) Notice: Subject to any disclaimer, the term of this patent is extended or adjusted under 35 U.S.C. 154(b) by 0 days.

(21) Appl. No.: 18/367,203

(22) Filed: Sep. 12, 2023

Related U.S. Application Data

(63) Continuation of application No. 17/572,885, filed on Jan. 11, 2022, now Pat. No. 11,791,525.

(60) Provisional application No. 63/136,253, filed on Jan. 12, 2021.

(51) Int. Cl.
    *H03K 19/195* (2006.01)
    *G11C 19/32* (2006.01)
    *H01P 3/02* (2006.01)

(52) U.S. Cl.
    CPC ............. *H01P 3/026* (2013.01); *G11C 19/32* (2013.01)

(58) Field of Classification Search
    CPC ....... H03K 19/195; H03K 19/00; H03K 19/20; G06N 10/00; G11C 19/32; H01P 3/00; H01P 3/026
    USPC .................................. 377/64, 66, 73, 74, 81
    See application file for complete search history.

(56) References Cited

U.S. PATENT DOCUMENTS

| | | |
|---|---|---|
| 10,756,738 B2 | 8/2020 | Reohr |
| 10,778,229 B1 | 9/2020 | Osborn |
| 11,791,525 B1 * | 10/2023 | Osborn ............... G11C 11/44 377/64 |

* cited by examiner

*Primary Examiner* — Hai L Nguyen

(57) ABSTRACT

A reversible superconducting circuit includes two Josephson transmission lines. Inductors connect Josephson Junctions in the array. Each transmission line passes a fluxon along the Junctions. The circuit includes an interface with first and second shunt capacitors coupled to the first and second transmission lines, and a third shunt capacitor, forming a connecting circuit with the first and second shunt capacitors. The shunt capacitors include Josephson junctions in parallel. The connecting circuit receives an input fluxon and transmits an output fluxon. The circuit also includes a Josephson Junction and inductor in parallel with the third shunt capacitor, forming a storage circuit. The storage circuit stores a SFQ. The output fluxon has polarity based on the SFQ stored when the first fluxon is received. The input fluxon causes the polarity of the stored SFQ to be the same as the polarity of the input fluxon, immediately after the input fluxon is received.

18 Claims, 11 Drawing Sheets

| 1-input Shift Register | | | | |
|---|---|---|---|---|
| Parameter | Ideal value | Lower margin | Upper margin | Margin range |
| $I_0'/I_0$ | 1.6 | -90 % | +16 % | 106 % |
| $C_J'/C_J$ | 5.4 | -39 % | +68 % | 107 % |
| $I_{0B}/I_0$ | 4.7 | -29 % | +18 % | 47 % |
| $C_B/C_J$ | 7.5 | -31 % | +61 % | 92 % |
| $L_s/L$ | 20 | -37 % | +130 % | 167 % |

Fig. 7

| 2-input shift register | | | | |
|---|---|---|---|---|
| Parameter | Ideal value | Lower margin | Upper margin | Margin range |
| $I_0'/I_0$ | 1.6 | -78 % | +20 % | 98 % |
| $C_J'/C_J$ | 5.4 | -37 % | +79 % | 116 % |
| $I_{0B}/I_0$ | 4.7 | -30 % | +16 % | 46 % |
| $C_B/C_J$ | 75 | -35 % | +56 % | 91 % |
| $L_s/L$ | 20 | -35 % | +124 % | 159 % |

Fig. 8

| initial | | final | |
|---|---|---|---|
| $S$ | $s_{in}$ | $S'$ | $s_{out}$ |
| 1 | 1 | 1 | 1 |
| 1 | -1 | -1 | 1 |
| -1 | 1 | 1 | -1 |
| -1 | -1 | -1 | -1 |

Fig. 10

ASYNCHRONOUS REVERSIBLE FLUX SOLITON LOGIC GATES

CROSS REFERENCE TO RELATED APPLICATIONS

This application is a continuation of U.S. patent application Ser. No. 17/572,885, filed Jan. 11, 2022, for "Asynchronous Reversible Flux Soliton Logic Gates," which is based on U.S. provisional patent application No. 63/136,253, filed Jan. 12, 2021, for "Asynchronous Reversible Flux Soliton Logic Gates," the contents of which are hereby incorporated by reference in their entirety.

FIELD OF THE INVENTION

The present invention relates generally to logic gates, and in particular to logic gates implemented in reversible superconducting circuits.

BACKGROUND

"Reversible Fluxon Logic" (RFL) gates use Long Josephson Junctions (LJJs) combined with other elements to create new logic gates. RFL is different than other superconducting gates in two respects: the use of LJJs and the encoding of bits. RFL uses the polarity of a "flux soliton" or fluxon to encode the bit state ("0" or "1"). When viewing a schematic representing a fluxon logic gate, if the polarity of a fluxon has magnetic flux sticking upward out of the LJJ schematic on paper it may conventionally be designated a bit "1" state. In the same example, if the polarity of a fluxon has magnetic flux sticking downward in the LJJ schematic on paper it would be designated a bit "0" state. The LJJs not only allow the transmission of fluxons, but they also work to enable the reversible gate operations. Their operations would not be possible with conventional Josephson Transmission Lines (JTLs), e.g., JTLs used in RSFQ (Rapid Single Flux Quantum) logic, in place of the LJJs.

These fluxons are a type of single-flux quanta (SFQ), but we exclusively use the term fluxon (or flux soliton) below for SFQ in the LJJs to distinguish them from other SFQ. For SFQ in elements besides an LJJ, we use the term SFQ.

Previous gates used at least two LJJs in gates: ballistic gates have LJJ pairs. The input and output are described as the left and right LJJ, respectively, merely for convenience. One can be used for input and the other for output. However, all "ballistic" gates in RFL are reversible and unpowered besides the input bits. As a result, one could have the right LJJ as the input and the result would come out on the left LJJ—this is the point of reversibility.

Ballistic RFL gates use no external power, but rather only some energy of the input fluxons (bits) themselves. In the case of non-ballistic RFL gates, energy is supplied by fluxons which are not data per se. They move the stored bit to one of two outputs. Those gates were called "Store and Launch" (SNL).

SUMMARY

One embodiment of the present invention is a reversible superconducting circuit. The circuit includes first and second Josephson transmission lines. Each Josephson transmission line includes a discretized Long Josephson Junction, including a parallel array of Josephson Junctions and a plurality of superconducting inductors. The inductors connect the Josephson Junctions in the array. Each Josephson transmission line is configured to pass a fluxon ballistically along the length of the array of Josephson Junctions, the fluxon being a soliton having total flux equal to $\Phi_0$, where $\Phi_0$ is the magnetic flux quantum. The circuit also includes an interface cell, coupled to the first and second Josephson transmission lines, including a first shunt capacitor, coupled to the first Josephson transmission line, a second shunt capacitor, coupled to the second Josephson transmission line, a third shunt capacitor, coupled to and connecting the first shunt capacitor and the second shunt capacitor, and first, second, and third Josephson Junctions connected in parallel with the first, second, and third shunt capacitors, respectively. The circuit also includes a wire connecting the first and second shunt capacitor and an inductor, connected in parallel to and forming a storage circuit with the third shunt capacitor and the third Josephson Junction. The storage circuit is configured to store a SFQ having a polarity. The reversible superconducting circuit is configured to receive an input fluxon on the first Josephson transmission line and immediately and subsequently emit a fluxon on the second Josephson transmission line. The output fluxon has a polarity equal to the polarity of the SFQ stored in the storage circuit immediately prior to when the first fluxon is received from the first Josephson transmission line. The input fluxon causes the polarity of the SFQ stored in the storage circuit to be the same as the polarity of the input fluxon, immediately after the input fluxon is received.

BRIEF DESCRIPTION OF THE DRAWINGS

FIG. 7 is a table including parameter values for the shift register of FIG. 3.

FIG. 8 is a table including parameter values for the shift register of FIG. 5.

FIG. 10 is a logic table corresponding to operation of the shift register of FIG. 3.

DETAILED DESCRIPTION

Novel shift registers are disclosed herein in accordance with embodiments of the present invention, which may be made to work with high energy efficiency in superconducting circuits, as described. The gates described herein are "Reversible Fluxon Logic" (RFL) gates. RFL logic uses Long Josephson Junctions (LJJs) combined with other elements to create new logic gates. Embodiments discussed below include: a reversible or ballistic Shift Register (SR), a multi-bit SR, and a 2-input SR.

Figure 1:
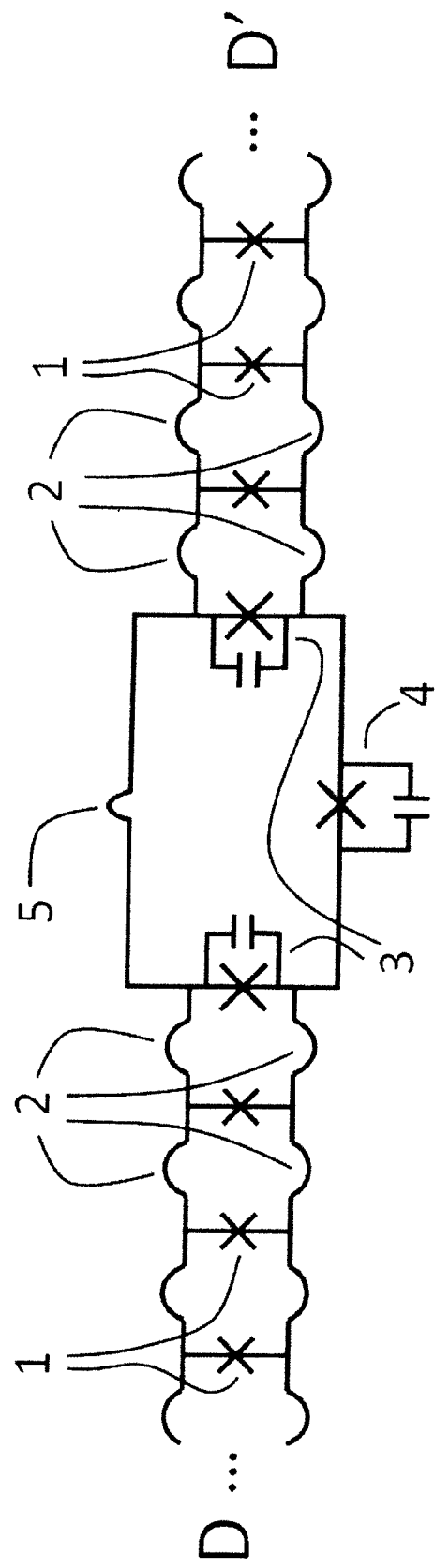
FIG. 1 is a schematic of a prior art reversible superconducting circuit that with certain parameters may be a NOT or ID gate.

FIG. 1 is a schematic of a prior art gate as was disclosed previously in U.S. Pat. No. 10,778,229 to Kevin Osborn et al. The gate comprises Josephson junctions 1 (JJs) and inductors 2. The parts together make an LJJ to the left and right sides of the schematic. Shunt capacitors 3, 4, and Josephson junctions and an inductor 5 complete the gate. The LJJs allow the fluxons to travel ballistically (without external power) far away from the center of the gate. Near the center of the gate, the LJJs are an important component for the gate dynamics (and operation). The fluxon in this schematic is known to break into two partial fluxons at the interface during the dynamics of this gate. The result is carried as the polarity of the output fluxon. The basic logic gates that this structure may be used to implement, which use different parameter values, are NOT and ID gates. Shunt capacitors 3, 4 are capacitors added in parallel to the regular JJs (compare to JJs 1). These shunt capacitors enable particular useful dynamics.

Figure 2:
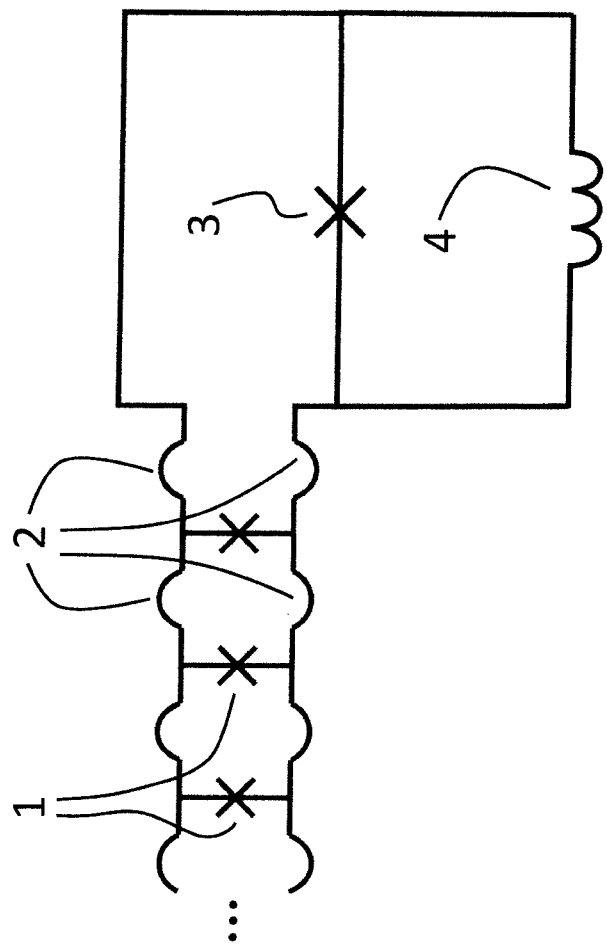
FIG. 2 is a schematic of a prior art reversible superconducting circuit called a Reversible Memory Cell.

FIG. 2 is a schematic of a prior art gate proposed by Mike Frank of Sandia National Laboratories. It shows a single LJJ terminated with an inductor loop. It is described as a reversible memory cell. An input fluxon can be stored in the inductor loop. The output fluxon which results afterward has the polarity of the stored fluxon. This gate does not include shunt capacitors. It is less practical than a multi-port gate because when computing with pulses it is especially beneficial to have a physical separation of output from input such that the output can be processed with a simple circuit that responds to any appreciable signal on the line.

Figure 3:
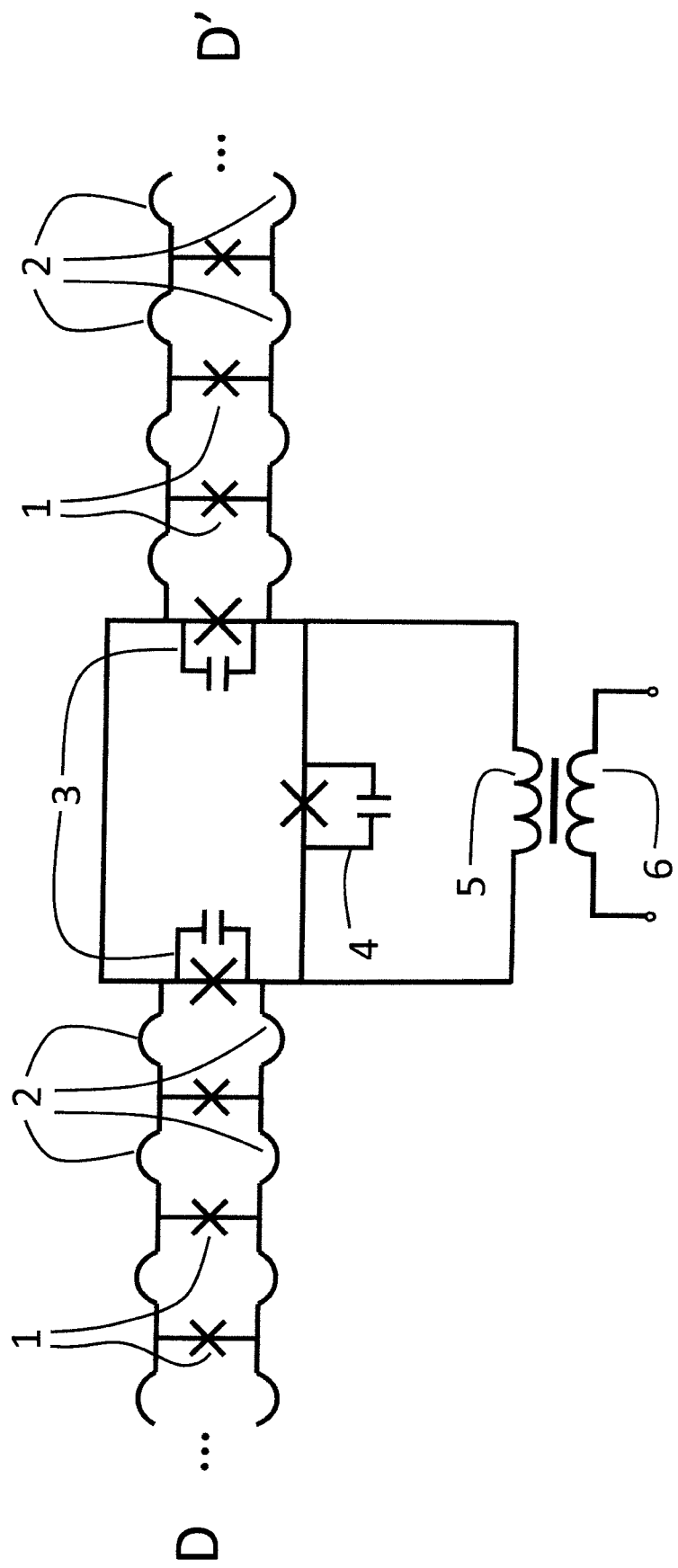
FIG. 3 is a schematic of a reversible superconducting shift register in accordance with an embodiment of the present invention.

FIG. 3 is a schematic of a ballistic shift register (SR), a new type of shift register (memory). The schematic is related to FIG. 1 in that it is a ballistic RFL gate, but it is different in many ways. It includes two LJJs (left and right, composed of JJs 1 and inductors 2), like the gate of FIG. 1. It also includes shunt capacitors 3, which are similar to parts in FIG. 1. However, it has an inductive loop (including a rail JJ in parallel with a shunt capacitor 4, and a storage inductor 5), which allows bit storage, while FIG. 1 does not. The bit stored is an SFQ, where polarity encodes the bit memory. This allows for the novel inclusion of a memory in a multiport ballistic RFL gate. It is also called asynchronous ballistic because there is no relative timing required for the input bits other than a minimum delay between the subsequent bits. This is also associated with the concept of asynchronous logic like FIG. 2. The initialization of this gate can be accomplished with a current through a mutual inductor 6, but during regular gate operation no current is needed here. Also, it is possible to initialize the gate with a fluxon without using the mutual inductor 6, but we show it here because it can be useful to initialize with it set to a DC value of current.

Figure 9:
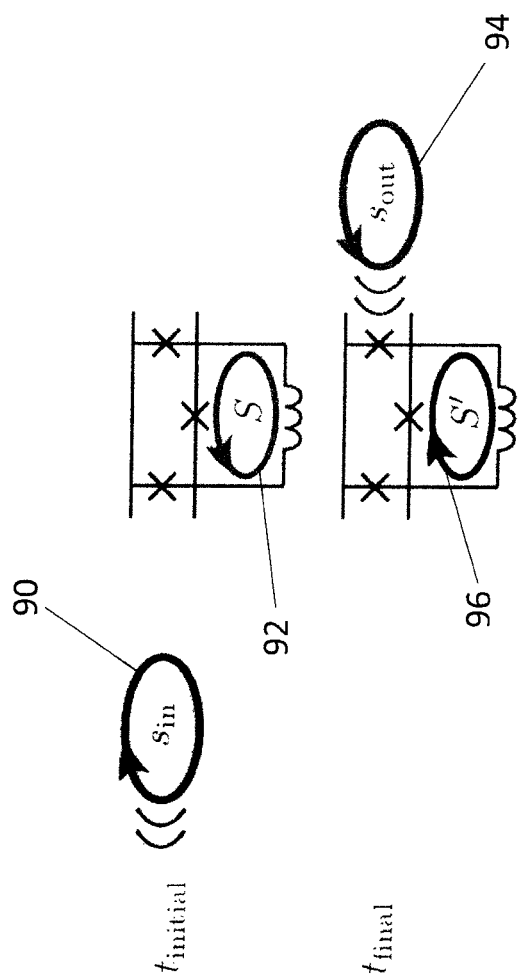
FIG. 9 is a diagram illustrating dynamic operation of the shift register of FIG. 3.

The dynamics of the shift register may be understood with reference to the simplified example in FIG. 9. An input fluxon 90 enters the system from the left with a polarity represented here as being oriented in a clockwise direction, while a SFQ 92 of opposite polarity is stored in the storage cell of the shift register. The input fluxon 90 then passes through the interface and begins to exit the system to the right as an output fluxon 94. The output fluxon 94 now has a polarity matching the polarity of SFQ 92 that was stored in the system before the interaction. Meanwhile, the storage cell of the shift register now stores a SFQ 96 that has the polarity that the input fluxon 90 had when it entered the system. FIG. 10 is a logic table that fully describes the outcomes that may be obtained after such an interaction based on the initial polarities for the input fluxon 90 and stored SFQ 92 leading to the resulting polarities of the output fluxon 94 and updated stored SFQ 96.

Figure 6A:
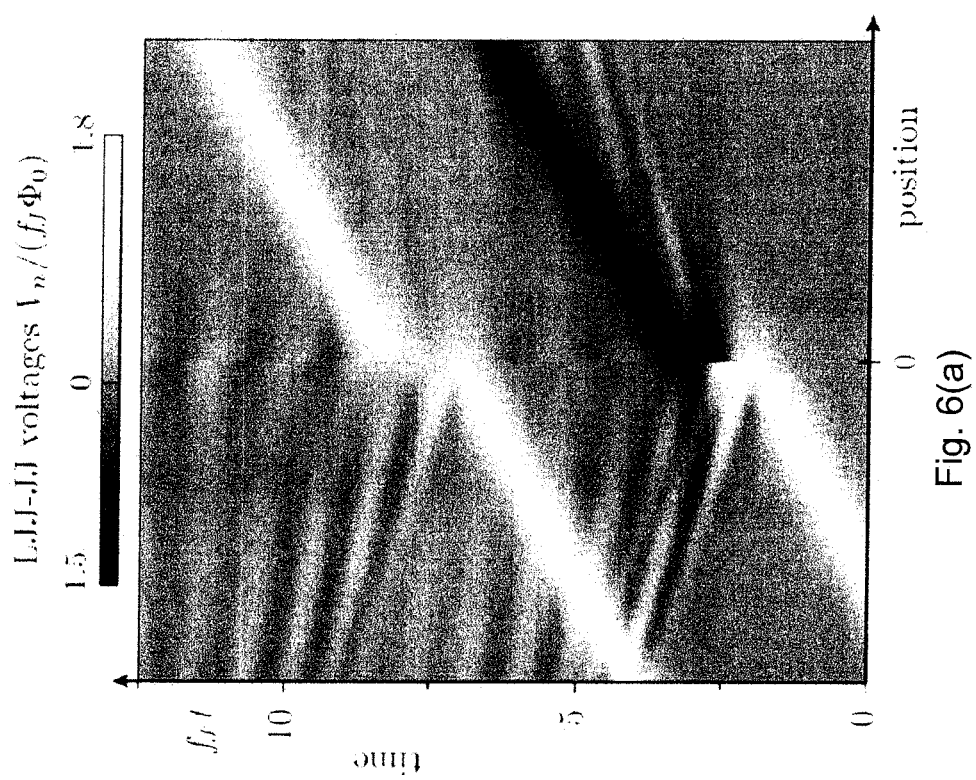
FIGS. 6(a) and 6(b) are graphs illustrating operational dynamics of a shift register in accordance with an embodiment of the present invention.

FIG. 6(a) shows a plot of the calculated dynamics of the SR. The fluxon in motion produces a positive or negative voltage pulse across the JJs of the LJJ (element 1 of FIG. 3). First, at a time near zero, a fluxon with positive voltage (and polarity) moves toward position 0, the center of the BSR gate, as seen as a (white color) track (in time versus position). After some collision time, the stored bit changes polarity because the stored bit (an SFQ) has opposite polarity than the input fluxon. The input bit with positive polarity is getting stored and the old bit is being shifted forward as a fluxon, as expected. The output fluxon is seen as a connected (black color) track with negative voltage (and polarity). In these plots the time axis is multiplied by the JJ frequency, $f_J$. Likewise, the LJJ voltages are divided by $f_J$ and the magnetic flux quantum Do.

Figure 6B:
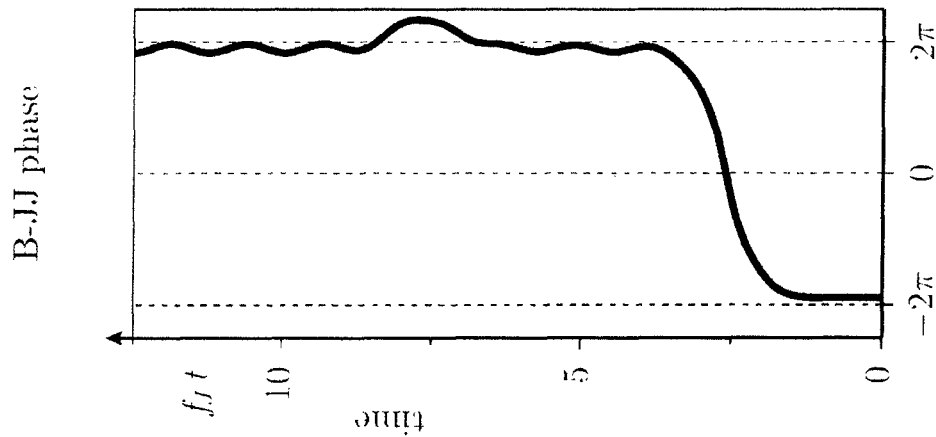

FIG. 6(b) shows a graph illustrating the phase of the "B" JJ (see element 4 of FIG. 3) versus time, calculated for the same conditions as FIG. 6(a). The polarity of the bit is roughly equal to the phase of this JJ divided by $2\pi$. At small times, the polarity is −1, but then it changes to +1 shortly after the collision of the first fluxon with the center of the gate, which is at an approximate time of 2.5 and at the first hash mark, where the plot of time is shown in units of the typical JJ frequency. This shows that the first fluxon has positive polarity and is stored as an SFQ in the storage inductor. This shows that the second input fluxon has positive polarity since the stored state did not change from the collision at an approximate time of 7.5 and at the third hash mark, where the plot of time is shown in units of the typical JJ frequency.

At a time of approximately 5, the first fluxon result exits the plot to the right while the second input fluxon enters from the left. The second input fluxon has positive polarity (see FIG. 6(a)). The second input fluxon collides with the gate at an approximate time of 7.5, in the same units as described above. The positive polarity fluxon now interacts with a positive polarity SFQ in the gate memory. The result is a fluxon that scatters forward without polarity change (white color track with no associated change in B-JJ phase). In FIG. 6(b) the time of 7.5 corresponds roughly to the third tick mark in FIG. 6(b). The phase is roughly constant through the collision, showing that the new stored state is equal to the input state. In summary, the input state always becomes the newly stored state and the output state equals the old stored state, all without external power applied to the gate other than the input bits.

Figure 4:
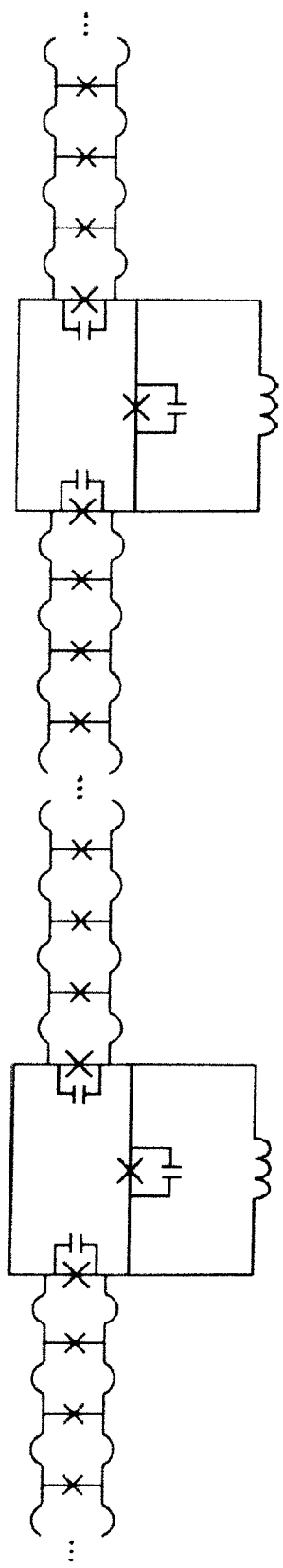
FIG. 4 is a schematic of a reversible superconducting multi-bit Serial-In-Serial-Out shift register in accordance with an embodiment of the present invention.

FIG. 4 is a schematic illustrating shift registers in a sequence for a multi-bit SR memory. Each register can store a bit. When an input fluxon comes in from the left, it can cause the left ballistic shift register (BSR) to store and forward information, and then the forwarded bit can cause the next BSR to store and forward information. The inventor has demonstrated that gates including multiple shift registers as shown here may be implemented successfully, but there is a practical limit to the length of how many bits may be stored in sequence. This is because every output fluxon is slower than the input fluxon, and there is a threshold input velocity for the BSR to work.

FIG. 7 is a table including parameter values for the 1-input SR of FIG. 3. The inventors have determined certain parameter values that work well for this specific implementation, as well as a range of variations to these parameter values that can be tolerated while maintaining functionality. The ideal value column in the table provides values for parameters of the SR. The ideal parameter is calculated from maximum output to input velocity ratio with a requirement that the output to input velocity ratio is 0.6, and the assumed input velocity is 0.6 times the maximum theoretical value. Parameter locations can be obtained from FIG. 3. With reference to FIG. 3, LJJs include inductors 2, and JJs 1, which both have critical current and capacitance. The inductance per cell is L, and it is composed of two inductors 2, one on the upper rail, and one on the lower rail. The JJs 1 have a critical current of $I_0$ and a capacitance of $C_J$. FIG. 3 also shows termination JJs with shunt capacitors 3. The JJ critical current is $I_0'$, and the total capacitance is composed of a JJ capacitance and a shunt capacitance together, which is $C_J'$. One terminal of each of these termination JJs with shunt capacitors are connected with low inductance wire. The other two terminals are connected by a rail JJ and shunt capacitor 4 and having values of critical current $I_{0B}$, and total capacitance $C_B$. A storage inductor 5 which has inductance $L_s$ is connected in parallel with the rail JJ and shunt capacitor 4. It stores an SFQ under normal operation. FIG. 3 also shows an inductor 6 which can be current biased for initialization, but it is not biased during normal gate operation. In FIG. 7, next to the ideal value column, the next two columns to the right give the amount one can change a single parameter from the ideal value (now a reference value) and still have the gate work within the criterion of output to input velocity ratio of at least 60%. The rightmost column gives the margin range, which is the sum of the lower and upper margin range. The table shows good margins for all gates.

Figure 5:
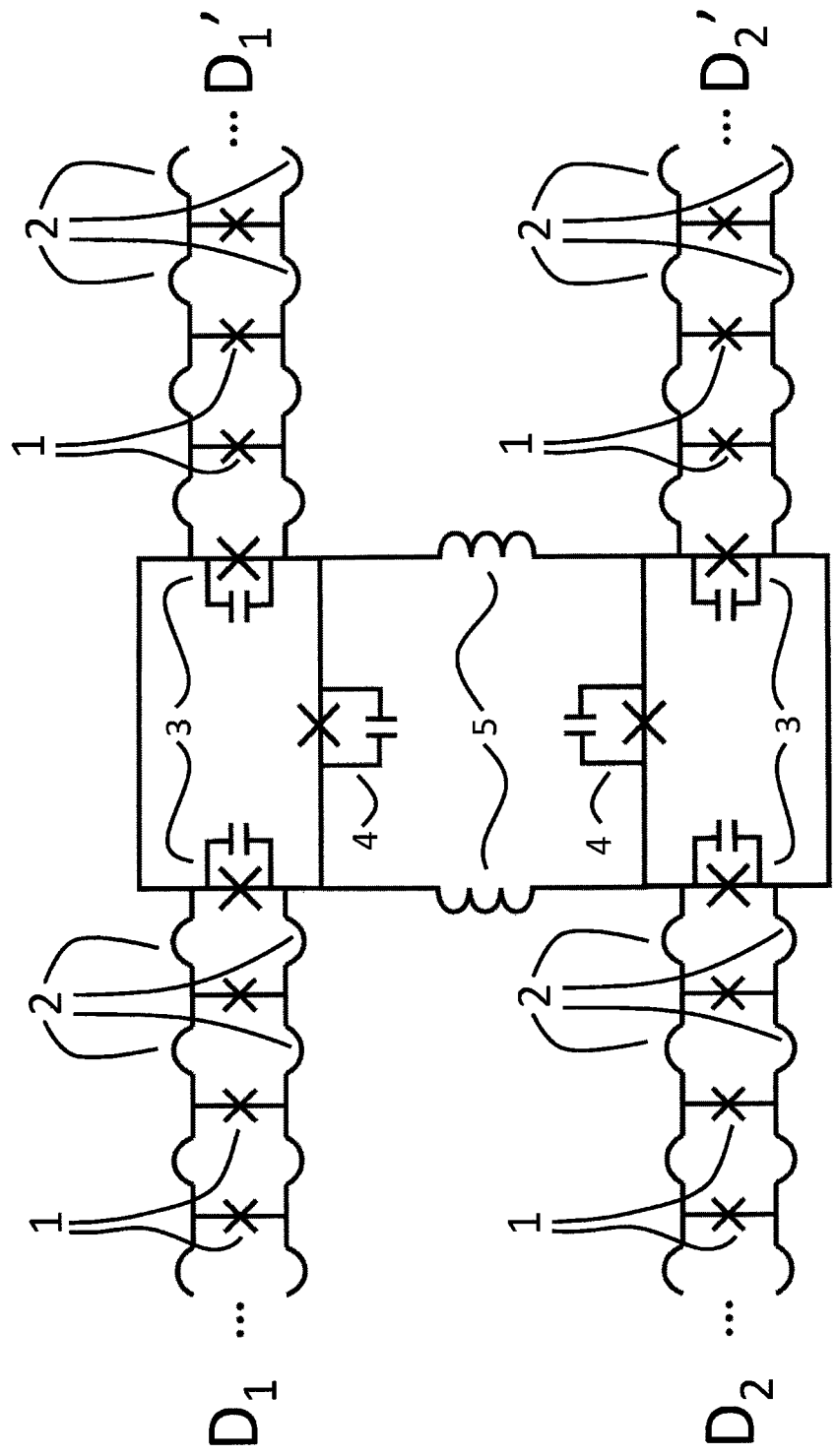
FIG. 5 is a schematic of a reversible superconducting shift register with multiple inputs and multiple outputs in accordance with an embodiment of the present invention.

FIG. 5 is a schematic illustrating a 2-input SR. This embodiment includes additional elements beyond what were present in the 1-input version shown in FIG. 3. The memory is stored in inductor 5. Now the shift register can be operated from input $D_1$, resulting in an output $D_1'$ or from input $D_2$, resulting in an output $D_2'$. The margins are very similar as in the 1-input register but this new architecture implies that one input-output pair could be used for writing and the other for reading. Also, it can be a way to switch between bitlines, since a bit could come in on $D_1$ and be output on $D_2'$.

FIG. 8 is a table including parameter values and margins for the 2-input shift register. The ideal values and margins are similar to those of the 1-bit SR shown in FIG. 6. The reason for this is that one input-output LJJ pair acts to only slightly change the dynamics when a fluxon enters on the other LJJ pair. This is because the other LJJ pair in that case acts similar to an inductor, as if it is part of the storage inductor 5.

While the above description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments described herein can be embodied within a form that may not provide all of the features and benefits set forth herein, as some features can be used or practiced separately from others. The scope of the invention is indicated by the appended claims rather than the foregoing description. All changes which come within the meaning and range of equivalency of the claims are to be embraced within their scope.

We claim:

1. A reversible superconducting circuit comprising:
   first, second, third, and fourth Josephson transmission lines, wherein:
   each Josephson transmission line includes:
   a discretized Long Josephson Junction, including:
   a parallel array of Josephson Junctions; and
   a plurality of superconducting inductors, wherein the inductors connect the Josephson Junctions in the array; and
   each Josephson transmission line is configured to pass a fluxon ballistically along the length of the array of Josephson Junctions, the fluxon being a soliton having total flux equal to $\Phi_0$, where $\Phi_0$ is the magnetic flux quantum;
   a first interface cell, coupled to the first and second Josephson transmission lines, comprising:
   a first shunt capacitor, coupled to the first Josephson transmission line;
   a second shunt capacitor, coupled to the second Josephson transmission line;
   a third shunt capacitor, connected to the first shunt capacitor and the second shunt capacitor;
   a first wire connecting two of the terminals of the first and second shunt capacitors; and
   first, second, and third Josephson Junctions connected in parallel with the first, second, and third shunt capacitors, respectively;
   a second interface cell, coupled to the third and fourth Josephson transmission lines, comprising:
   a fourth shunt capacitor, coupled to the third Josephson transmission line;
   a fifth shunt capacitor, coupled to the fourth Josephson transmission line;
   a sixth shunt capacitor, connecting the fourth shunt capacitor and the fifth shunt capacitor;
   a second wire connecting the fourth and fifth shunt capacitors; and
   fourth, fifth, and sixth Josephson junctions connected in parallel with the fourth, fifth, and sixth shunt capacitors, respectively; and
   first and second inductors, coupled to and forming a storage circuit with the third Josephson Junction and the sixth Josephson Junction, wherein the storage circuit is configured to store a single-flux quantum (SFQ) having a polarity;
   wherein the first inductor connects to two of the terminals between the third and sixth Josephson junction and the second inductor connects between the remaining two terminals between the third and sixth Josephson junction;
   wherein receiving an input fluxon on the first Josephson transmission line causes an output fluxon to be emitted on the second Josephson transmission line, and receiving an input fluxon on the third Josephson transmission line causes an output fluxon to be emitted on the fourth transmission line;
   wherein the output fluxon has the same polarity as the SFQ stored in the storage circuit immediately prior to when the input fluxon was received; and
   wherein the input fluxon causes the polarity of the SFQ stored in the storage circuit immediately after said input fluxon is received to be the same as the polarity of said input fluxon.

2. A reversible superconducting circuit configured to form a multi-input shift register, comprising:
   a first bitline defined by input and output portions coupled to a first interface cell disposed therebetween, the input portion including a first Josephson transmission line and the output portion including a second Josephson transmission line;
   a second bitline defined by input and output portions coupled to a second interface cell disposed therebetween, the input portion including a third Josephson transmission line and the output portion including a fourth Josephson transmission line; and, a storage circuit coupled to the first and second interface cells, the storage circuit including first and second storage inductors for storing single-flux quanta (SFQ) having a polarity;

wherein each of the first, second, third, and fourth Josephson transmission lines includes a plurality of Josephson Junctions disposed in parallel and coupled to a plurality of superconducting inductors for passing a fluxon ballistically therealong; and, wherein responsive to an input fluxon received in the input portion of one of the first and second bitlines, the storage circuit stores a current SFQ in place of a previously stored SFQ, and the output portion of one of the first and second bitlines emits an output fluxon, the current SFQ being determined in polarity by the input fluxon, the output fluxon being determined in polarity according to the previously stored SFQ.

3. The reversible superconducting circuit as recited in claim 2, wherein each of the first, second, third, and fourth Josephson transmission lines is configured to pass a fluxon in the form of a soliton having total flux equal to a predetermined magnetic flux quantum $\Phi_0$.

4. The reversible superconducting circuit as recited in claim 2, wherein the storage circuit stores the current SFQ with the same polarity as the input fluxon, and one of the output portions emits the output fluxon with the same polarity as the previously stored SFQ.

5. The reversible superconducting circuit as recited in claim 2, wherein the Josephson Junctions within each of the Josephson transmission lines are coupled one to the other by the superconducting inductors extending respectively therebetween to form a discretized Long Josephson Junction.

6. The reversible superconducting circuit as recited in claim 2, wherein the first and second storage inductors of the storage circuit each extend between the first and second interface cells of the first and second bitlines.

7. The reversible superconducting circuit as recited in claim 6, wherein each of the first and second interface cells includes a plurality of interface pairs each formed by a parallel-coupled pairing of a shunt capacitor and a Josephson Junction, the interface pairs of the first interface cell being coupled in parallel with respective Josephson Junctions of the input and output portions of the first bitline, the interface pairs of the second interface cell being coupled in parallel with respective Josephson Junctions of the input and output portions of the second bitline.

8. The reversible superconducting circuit as recited in claim 6, wherein the storage circuit includes first and second storage interface pairs each formed by a parallel-coupled pairing of a shunt capacitor and a Josephson Junction, each of the first and second storage interface pairs being coupled to extend between corresponding terminals of the first and second storage inductors.

9. A reversible superconducting circuit configured to form a shift register, comprising:

a plurality of bitlines each defined by input and output portions coupled to an interface cell disposed therebetween, each of the input and output portions defining a Josephson transmission line configured to pass a fluxon ballistically therealong, wherein the Josephson transmission line includes:

an array of Josephson Junctions; and, a plurality of superconducting inductors disposed in the array to intercouple the Josephson Junctions in parallel; and, a storage circuit coupled to the interface cell of at least one bitline, the storage circuit including at least one storage inductor for storing single-flux quanta (SFQ) having a polarity and at least one interface pair formed by a parallel-coupled pairing of a shunt capacitor and a Josephson Junction;

wherein responsive to an input fluxon received in the input portion of the bitline, the storage circuit stores a current SFQ in place of a previously stored SFQ, and the output portion of the bitline emits an output fluxon; and, wherein the current SFQ is determined in polarity by the input fluxon, and the output fluxon is determined in polarity according to the previously stored SFQ;

wherein the interface cell of the bitline includes a plurality of interface pairs each formed by a parallel-coupled pairing of a shunt capacitor and a Josephson Junction, the interface pairs being coupled in parallel with respective Josephson Junctions of the input and output portions of the bitline.

10. The reversible superconducting circuit as recited in claim 9, wherein each of the Josephson transmission lines is configured to pass a fluxon in the form of a soliton having total flux equal to a predetermined magnetic flux quantum $\Phi_0$.

11. The reversible superconducting circuit as recited in claim 10, wherein the storage circuit stores the current SFQ with the same polarity as the input fluxon, and one of the output portions emits the output fluxon the same polarity as the previously stored SFQ.

12. The reversible superconducting circuit as recited in claim 11, wherein the Josephson Junctions within each of the Josephson transmission lines are coupled one to the other by the superconducting inductors extending respectively therebetween to form a discretized Long Josephson Junction.

13. The reversible superconducting circuit as recited in claim 9, wherein responsive to an input fluxon received in the input portion of one of the bitlines, the storage circuit stores a current SFQ in place of a previously stored SFQ, and the output portion of one of the bitlines emits an output fluxon.

14. The reversible superconducting circuit as recited in claim 13, wherein the storage circuit includes a plurality of storage inductors each extending between the interface cells of the bitlines.

15. The reversible superconducting circuit as recited in claim 14, wherein the storage circuit includes a plurality of storage interface pairs each formed by a parallel-coupled pairing of a shunt capacitor and a Josephson Junction, each of the storage interface pairs being coupled to extend between corresponding terminals of opposing storage inductors.

16. The reversible superconducting circuit as recited in claim 15, wherein the Josephson Junctions within each of the Josephson transmission lines are coupled one to the other by the superconducting inductors extending respectively therebetween to form a discretized Long Josephson Junction.

17. The reversible superconducting circuit as recited in claim 16, wherein the storage circuit stores the current SFQ with the same polarity as the input fluxon, and one of the output portions emits the output fluxon with the same polarity as the previously stored SFQ.

18. A multi-bit shift register comprising a plurality of reversible superconducting circuits each in accordance with claim 9, connected in sequence.

* * * * *